United States Patent
Hargrove et al.

(10) Patent No.: US 8,039,349 B2
(45) Date of Patent: Oct. 18, 2011

(54) METHODS FOR FABRICATING NON-PLANAR SEMICONDUCTOR DEVICES HAVING STRESS MEMORY

(75) Inventors: Michael J. Hargrove, Clinton Corners, NY (US); Frank Scott Johnson, Wappinger Falls, NY (US); Scott Luning, Poughkeepsie, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 19 days.

(21) Appl. No.: 12/512,814

(22) Filed: Jul. 30, 2009

(65) Prior Publication Data

US 2011/0027978 A1    Feb. 3, 2011

(51) Int. Cl.
*H01L 21/8234* (2006.01)

(52) U.S. Cl. ........ 438/275; 438/166; 438/486; 438/525; 257/E21.057; 257/E21.059; 257/E21.412

(58) Field of Classification Search .............. 438/181, 438/369, 373, 519; 257/E21.056, E21.057, 257/E21.059, E21.4
See application file for complete search history.

(56) References Cited

U.S. PATENT DOCUMENTS

| | | | | |
|---|---|---|---|---|
| 2006/0076643 A1* | 4/2006 | Breitwisch et al. | ........... | 257/530 |
| 2007/0105299 A1* | 5/2007 | Fang et al. | ..................... | 438/199 |
| 2007/0249130 A1* | 10/2007 | Anderson et al. | ............. | 438/301 |
| 2009/0072276 A1* | 3/2009 | Inaba | ........................... | 257/255 |
| 2009/0114955 A1* | 5/2009 | Stapelmann et al. | ......... | 257/255 |

\* cited by examiner

*Primary Examiner* — Charles Garber
*Assistant Examiner* — Cheung Lee
(74) *Attorney, Agent, or Firm* — Ingrassia Fisher & Lorenz, P.C.

(57) ABSTRACT

Embodiments of a method are provided for fabricating a non-planar semiconductor device including a substrate having a plurality of raised crystalline structures formed thereon. In one embodiment, the method includes the steps of amorphizing a portion of each raised crystalline structure included within the plurality of raised crystalline structures, forming a sacrificial strain layer over the plurality of raised crystalline structures to apply stress to the amorphized portion of each raised crystalline structure, annealing the non-planar semiconductor device to recrystallize the amorphized portion of each raised crystalline structure in a stress-memorized state, and removing the sacrificial strain layer.

4 Claims, 7 Drawing Sheets

METHODS FOR FABRICATING NON-PLANAR SEMICONDUCTOR DEVICES HAVING STRESS MEMORY

TECHNICAL FIELD

The present invention relates generally to non-planar semiconductor devices and, more particularly, to embodiments of a method for fabricating a non-planar semiconductor device wherein stress memory is imparted to one or more raised crystalline structures (e.g., fin structures) included within the non-planar semiconductor device.

BACKGROUND

In contrast to conventional planar metal-oxide-semiconductor field-effect transistors ("MOSFETs"), multi-gate transistors incorporate two or more gates into a single device. Relative to single gate transistors, multi-gate transistors reduce off-state current leakage, increase on-state current flow, and reduce overall power consumption. Multi-gate devices having non-planar topographies also tend to be more compact than conventional planar transistors and consequently permit higher device densities to be achieved. One known type of non-planar, multi-gate transistor, commonly referred to as a "FinFET," includes at least one fin structure formed on a substrate, such as a silicon-on-insulator substrate. The fin structure extends along a first axis between source and drain electrodes. At least one conductive gate stack is formed over the fin structure and extends along a second axis perpendicular to the first axis. More specifically, the gate stack extends across and over the fin structure such that an intermediate portion of the gate stack conformally overlays three surfaces of the fin structure (i.e., an upper surface, a first sidewall surface, and a second opposing sidewall surface of the fin structure).

It is well-established that the carrier mobility, and thus the switching speed, of a transistor can be significantly increased by applying a physically-deforming force ("stress") to a transistor's channel region sufficient to induce a physical deformation ("strain") within the silicon lattice. In the context of conventional planar transistors, stress can be applied to the channel region utilizing any one of a number of relatively straightforward straining techniques; e.g., in one common method, a strained layer of silicon nitride ($Si_3N_4$) is used as a contact etch stop and deposited over the final gate and source drain structure to apply a shear force thereto sufficient to induce strain within the channel region's crystal lattice; and, in another common method, a layer of silicon germanium (SiGe) is deposited in the source-drain region to apply a shear force thereto sufficient to induce strain within the channel region's crystal lattice. However, the unique topography of FinFETs and other non-planar semiconductor devices (e.g., triFETs) generally renders the implementation of conventional straining techniques excessively difficult. Even when it is practicable to utilize strain layers during the fabrication of a non-planar semiconductor device, any increase in carrier mobility improvement is typically limited; e.g., due to the lack of a confined source/drain, deposition of strained SiGe is predicted to result in a fraction (e.g., approximately half) of the carrier mobility achieved when similar straining techniques are utilized in conjunction with planar MOSFETs.

In view of the above, it is desirable to provide embodiments of a method for fabricating a non-planar semiconductor device, such as a FinFET, wherein stress memory is effectively imparted to one or more fin structures (or other raised crystalline structures) included within the non-planar semiconductor device. Ideally, embodiments of such a fabrication method would introduce strain directly to the fin structures through a multi-surface interface to optimize carrier mobility improvement. Other desirable features and characteristics of the present invention will become apparent from the subsequent Detailed Description and the appended Claims, taken in conjunction with the accompanying Drawings and this Background.

BRIEF SUMMARY

Embodiments of a method are provided for fabricating a non-planar semiconductor device including a substrate having a plurality of raised crystalline structures formed thereon. In one embodiment, the method includes the steps of amorphizing a portion of each raised crystalline structure included within the plurality of raised crystalline structures, forming a sacrificial strain layer over the plurality of raised crystalline structures to apply stress to the amorphized portion of each raised crystalline structure, annealing the non-planar semiconductor device to recrystallize the amorphized portion of each raised crystalline structure in a stress-memorized state, and removing the sacrificial strain layer.

BRIEF DESCRIPTION OF THE DRAWINGS

The present invention will hereinafter be described in conjunction with the following drawing figures, wherein like numerals denote like elements, and wherein.

DETAILED DESCRIPTION

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description.

Figure 1:
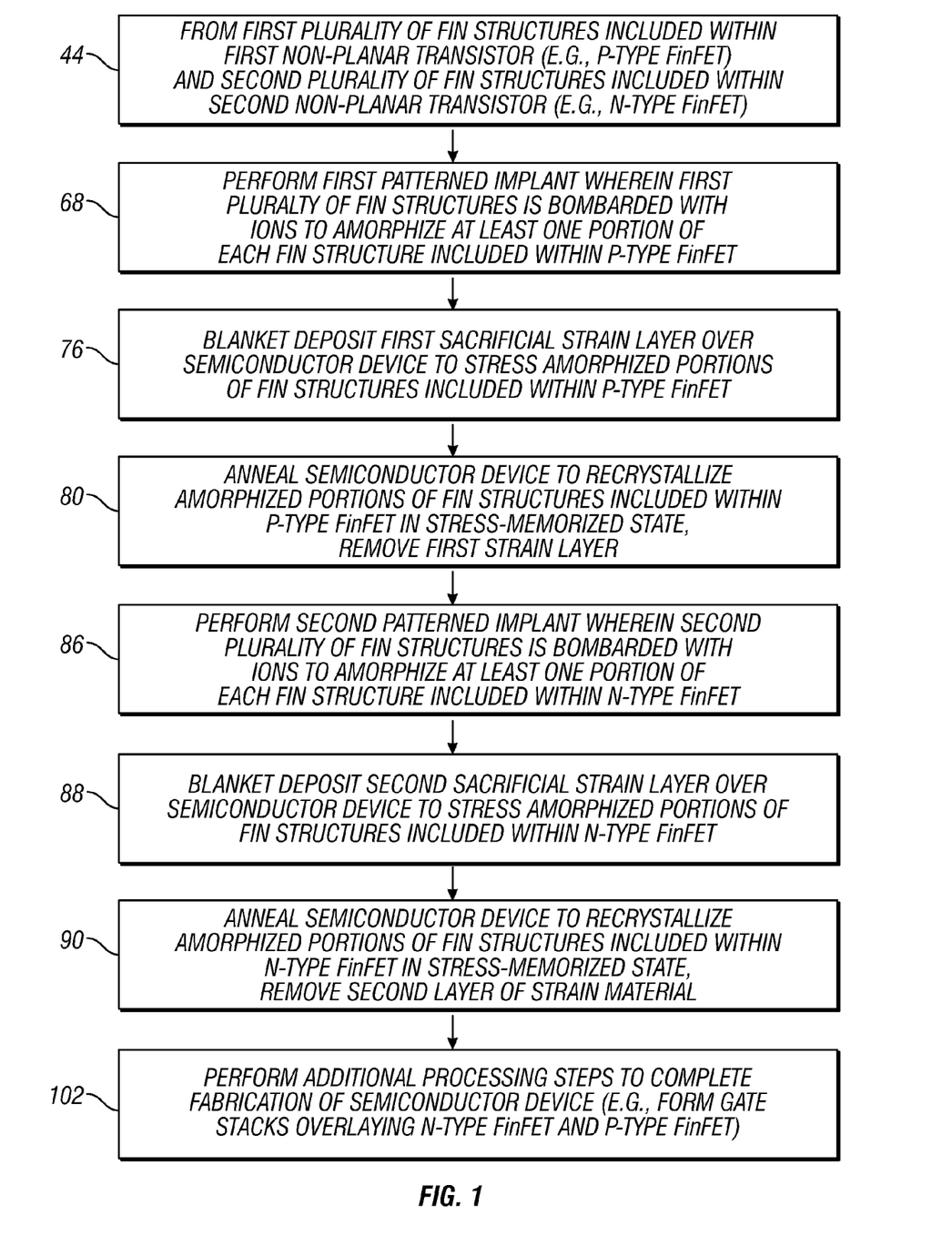
FIG. 1 is a flowchart illustrating a method for fabricating a semiconductor device wherein stress memory is imparted to a plurality of fin structures included within the semiconductor device in accordance with a first exemplary embodiment.

FIG. 1 is a flowchart illustrating an exemplary method for fabricating a non-planar semiconductor device in which stress memory is imparted to one or more raised crystalline structures, such as a plurality of fin structures. By way of non-limiting illustration, the exemplary method shown in FIG. 1 is described below in conjunction with an exemplary semiconductor device 40, 42 including two complementary non-planar transistors, namely, a P-type FinFET 40 and an N-type FinFET 42. FIGS. 2-16, also described below, are simplified cross-sectional views of semiconductor device 40, 42 illustrating P-type FinFET 40 and N-type FinFET 42 at various stages of fabrication and produced in accordance with the exemplary fabrication method shown in FIG. 1. The subsequent example notwithstanding, alternative embodiments of the semiconductor fabrication method can be utilized to fabricate various other non-planar semiconductor devices (e.g., triFETs) having at least one fin structure (or other raised crystalline structure) that can be stressed to increase carrier mobility, whether or not such non-planar semiconductor devices include complementary transistors.

Figure 2:
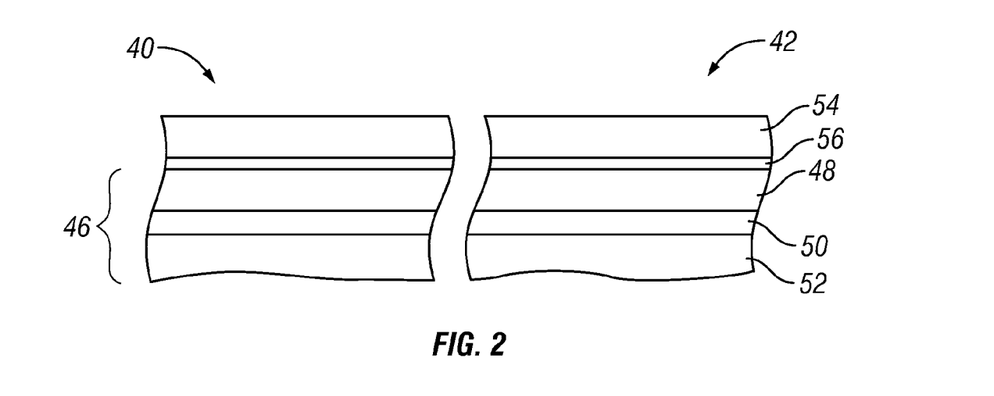
FIGS. 2-19 are simplified cross-sectional views of an exemplary semiconductor device including complementary FinFETs at various stages of fabrication and produced in accordance with the exemplary method illustrated in FIG. 1.

As indicated in FIG. 1 at STEP 44, the exemplary semiconductor fabrication method commences with the formation of at least one plurality of fin structures. In the exemplary case of semiconductor device 40, 42, a first plurality of fin structures included within P-type FinFET 40 and a second plurality of fin structures included within N-type FinFET 42 are formed overlying a semiconductor substrate 46 as illustrated in FIG. 2. Semiconductor substrate 46 is preferably a silicon substrate (the term "silicon substrate" encompassing the relatively pure silicon materials typically used in the semiconductor industry as well as silicon admixed with other elements, such as germanium and the like). Semiconductor substrate 46 can be a bulk silicon wafer. However, as indicated in FIG. 2, semiconductor substrate 46 preferably assumes the form a silicon-on-insulator wafer including a thin layer of silicon 48 overlying an intermediate insulating layer 50 that is, in turn, supported by a silicon carrier wafer 52. A mandrel-forming layer 54 is formed over upper silicon layer 48 of semiconductor substrate 46 utilizing a known deposition technique, such as chemical vapor deposition. A non-exhaustive list of materials that can be deposited to form mandrel-forming layer 54 includes polycrystalline silicon, silicon oxynitride, silicon oxide, and silicon nitride. One or more intervening layers (e.g., a hard mask layer) can also be formed between mandrel-forming layer 54 and upper silicon layer 48 of semiconductor substrate 46; for example, a silicon nitride layer 56 may be formed between mandrel-forming layer 54 and upper silicon layer 48 as indicated in FIG. 2.

Figure 3:
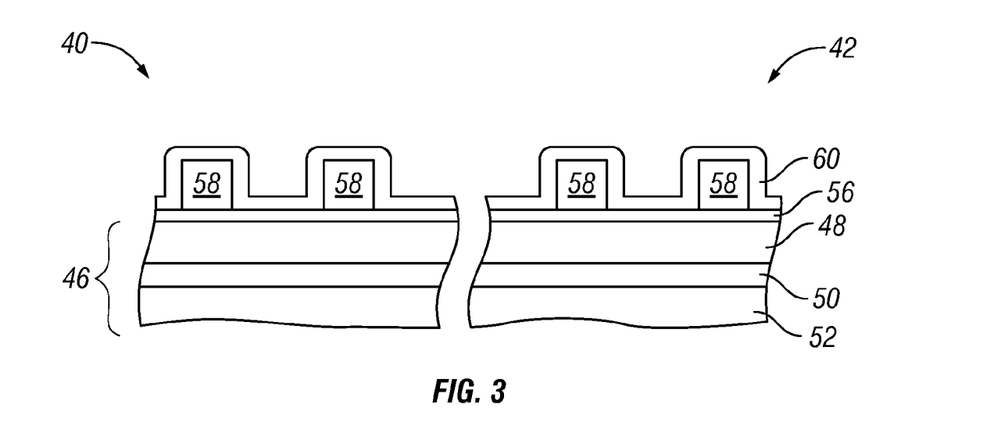

Turning now to FIG. 3, selected portions of mandrel-forming layer 54 are next removed to create a number of sacrificial mandrels 58 overlying semiconductor substrate 46. The selected portions of mandrel-forming layer 54 can be removed by first depositing photoresist over mandrel-forming layer 54, patterning the photoresist, etching the portions of mandrel-forming layer 54 exposed through the patterned photoresist, and subsequently removing the patterned photoresist. If desired, a plasma etching process can be utilized to remove the portions of mandrel-forming layer 54 exposed through the patterned photoresist or other mask. More specifically, a reactive ion etch process can be performed utilizing a chemistry selective to mandrel-forming layer 54. For example, if mandrel-forming layer 54 is formed from silicon nitride, a trifluoride/oxygen chemistry can be utilized; if mandrel-forming layer 54 is formed from silicon oxynitride or silicon oxide, a carbon hydro-trifluoride or tetrafluoromethane chemistry can be utilized; and if mandrel-forming layer 54 is formed from polycrystalline silicon, a chloride or bromous acid chemistry can be utilized.

After etching mandrel-forming layer 54 (FIG. 2) to yield sacrificial mandrels 58 in the above-described manner, a spacer-forming layer 60 is deposited over sacrificial mandrels 58 and silicon nitride layer 56 as further illustrated in FIG. 3. Spacer-forming layer 60 is conveniently formed via the blanket deposition of silicon nitride, silicon oxide, or another dielectric material. In a preferred group of embodiments, the composition of spacer-forming layer 60 is chosen to permit sacrificial mandrels 58 to be removed via a subsequent etching process that is selective to mandrel-forming layer 54 over spacer-forming layer 60; e.g., mandrel-forming layer 54 and spacer-forming layer 60 may comprise silicon nitride and silicon oxide, respectively, thereby permitting sacrificial mandrels formed from mandrel-forming layer 54 to be selectively removed utilizing a hot phosphoric acid wet etch. The thickness to which spacer-forming layer 60 is deposited will generally depend upon the desired critical dimensions of the final fin structure; however, as a non-limiting example, spacer-forming layer 60 may be deposited to a thickness of approximately 15 nanometers (nm) to approximately 40 nm.

Figure 4:
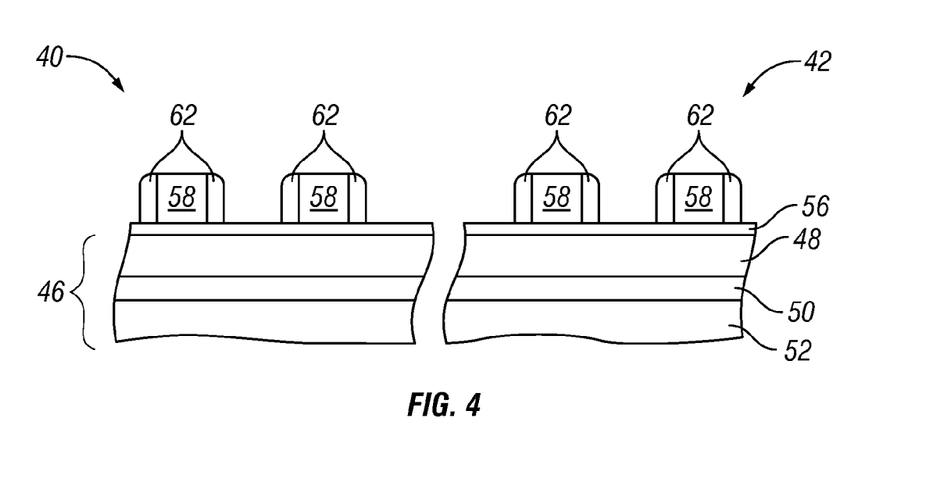
Figure 5:
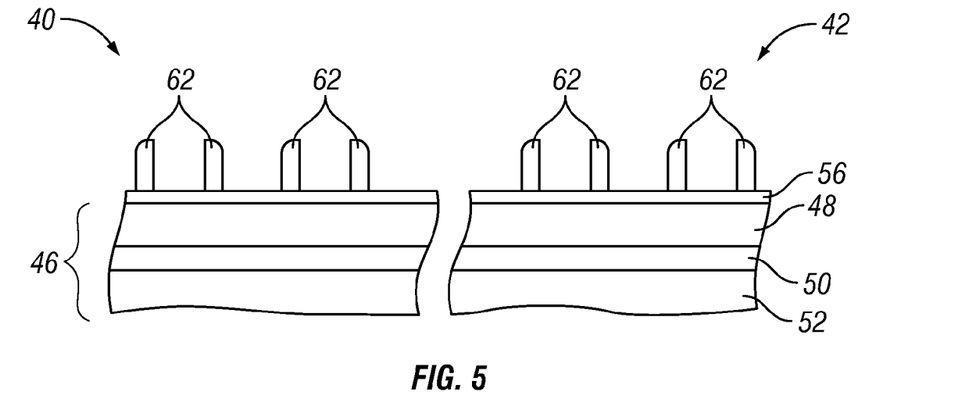
Figure 6:
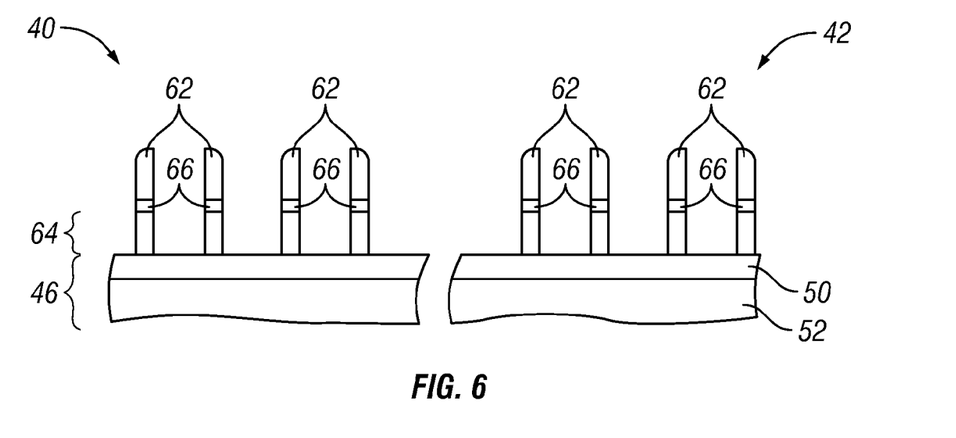
Figure 7:
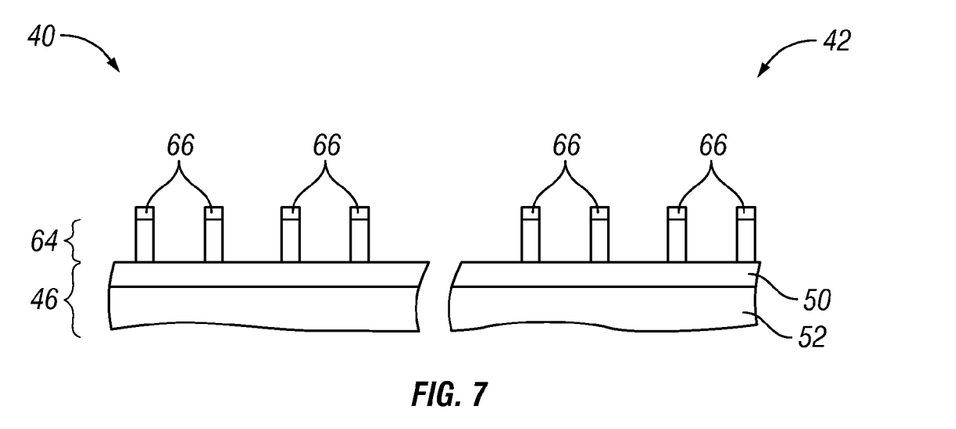

Next, as illustrated in FIGS. 4-7, partially-completed semiconductor device 40, 42 is subjected to a series of sequential etching steps. With reference to FIG. 4, an anisotropic or directional etch is first performed to remove selected portions of spacer-forming layer 60 and create sidewall spacers 62 adjacent opposing sides of each sacrificial mandrel 58. With reference to FIG. 5, a second etching process is then performed to selectively remove sacrificial mandrels 58 while generally leaving intact sidewall spacers 62; e.g., as previously stated, sacrificial mandrels 58 can be selectively removed utilizing a hot phosphoric acid wet etch in embodiments wherein sacrificial mandrels 58 and sidewall spacers 62 are formed from silicon nitride and silicon oxide, respectively. After removal of sacrificial mandrels 58, one or more additional etching steps are performed to remove the portions of silicon nitride layer 56 and upper silicon layer 48 that are not located beneath sidewall spacers 62. As illustrated in FIG. 6, the performance of these latter etching steps results in the formation of a plurality of fin structures 64 overly insulating layer 50 of semiconductor substrate 46. A silicon nitride cap 66 formed from silicon nitride layer 56 overlies each fin structure 64. Finally, and as illustrated in FIG. 7, sidewall spacers 62 are removed utilizing either a wet or dry etching process. A chemistry selective to sidewall spacers 62 is preferably employed during the selected etching process to minimize erosion of fin structures 64; e.g., if sidewall spacers 62 comprise silicon oxide, a carbon hydro-trifluoride or tetrafluoromethane chemistry can be utilized.

Figure 8:
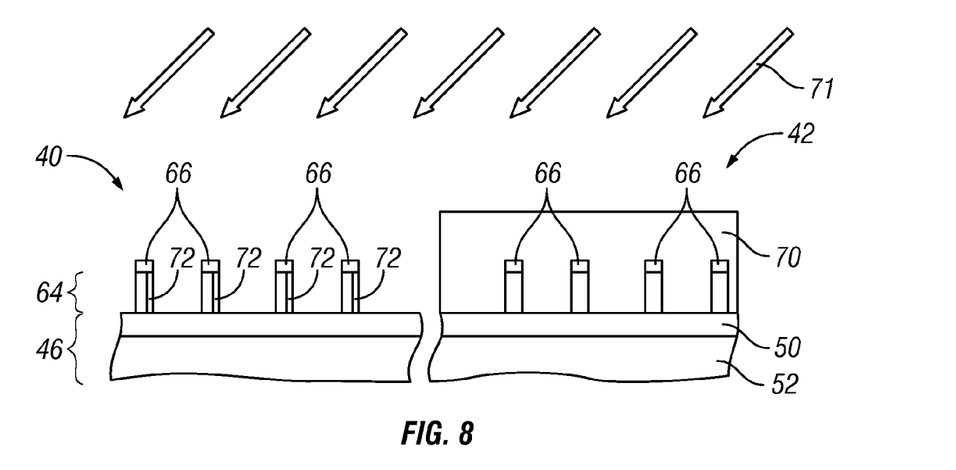
Figure 9:
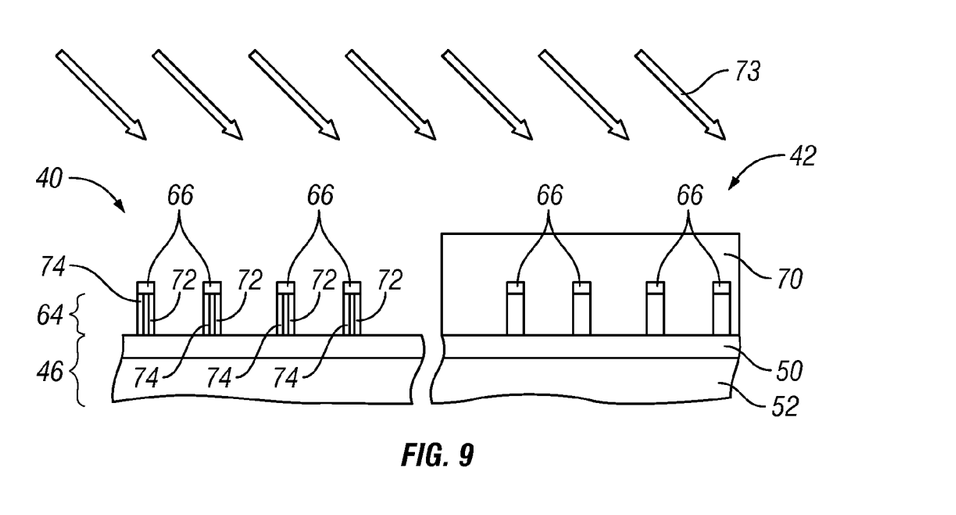

After the formation of fin structures 64 (STEP 44, FIG. 1), selected portions of each fin structure 64 included within P-type FinFET 40 are amorphized utilizing one or more angled ion implantation processes (STEP 68, FIG. 1). In the illustrated example, first and second patterned ion implantation processes are performed to amorphize opposing outer portions of fin structures 64 of P-type FinFET 40. More specifically, as indicated in FIG. 8 at 71, a first ion implantation process is performed to selectively amorphize a first sidewall portion 72 of each fin structure 64 included within P-type FinFET 40. Prior to ion implantation, a mask 70 is positioned over N-type FinFET 42 to prevent the amphorization of fin structures 64 included within N-type FinFET 42 during the performance of STEP 68 (FIG. 1). During the first ion implantation process (FIG. 8), semiconductor device 40, 42 is bombarded with ions from a first predetermined direction that forms a first predetermined acute grazing angle with the upper surface of semiconductor substrate 46. Similarly, as indicated in FIG. 9 at 73, a second ion implantation process is subsequently performed with mask 70 in place to selectively amorphize a second opposing sidewall portion 74 of each fin structure 64 included within P-type FinFET 40. During the second ion implantation process (FIG. 9), P-type FinFET 40 is bombarded with ions from a second predetermined direction that forms a second predetermined acute grazing angle with the upper surface of semiconductor substrate 46. The first and second predetermined directions are preferably rotationally offset by approximately 180 degrees, as rotated about an axis normal to semiconductor substrate 46. In one embodiment, the first patterned ion implantation is first performed, semiconductor device 40, 42 is rotated by 180 degrees, and then the second patterned ion implantation is performed. The first and second predetermined acute grazing angles are preferably substantially equivalent and may each be, for example, approximately 45 degrees.

In the above-described exemplary embodiment, first and second ion implantation processes are performed during STEP 68 (FIG. 1) to amorphize opposing outer portions of each fin structure 64 included within P-type FinFET 40. This example notwithstanding, the angle and energy of the ion implantation process or processes can be controlled such that any desired portion of each fin structure 64 included within P-type FinFET 40 is amorphized during STEP 68 of the exemplary semiconductor fabrication method shown in FIG. 1. For example, the ion implantation process or processes can be controlled such that an upper portion, a lower portion, or an inner portion of each fin structure 64 is amorphized during STEP 68 (FIG. 1). In certain embodiments, nearly all of the crystal lattice of each fin structure 64 can be amorphized during STEP 68, providing that a sufficient number of seed crystals are left in their original state to permit the amorphized portions of fin structure 64 to be recrystallized during the subsequent annealing process (described below). Regardless of the particular region or regions of fin structures 64 amorphized during STEP 68, it is preferred that fin structures 64 are implanted with at least one electrically neutral amphorizing species of ion that generally does not affect the electrical characteristics of the channel region. Suitable electrically neutral amphorizing species include, but are not limited to, argon, silicon, and xenon. It is also generally preferred that implantation of the selected amphorizing species is controlled so as to avoid significant doping of semiconductor substrate 46 and thereby permit substrate 46 to be doped independently at a later juncture in the semiconductor fabrication process.

Figure 10:
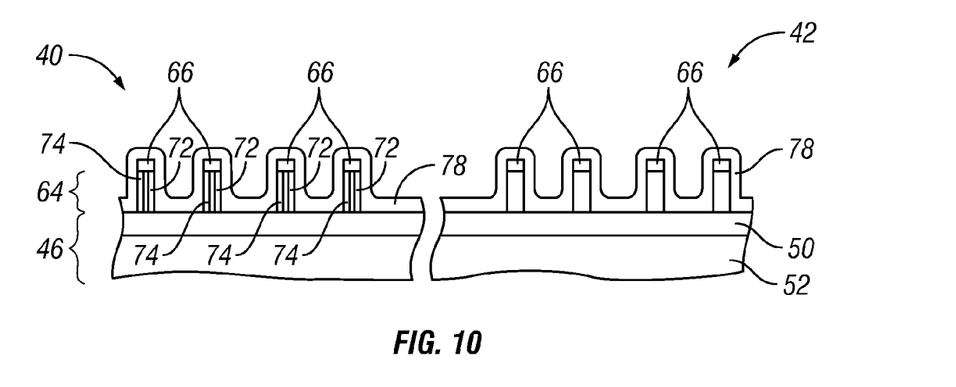

The exemplary semiconductor fabrication method continues with the blanket deposition of a first sacrificial strain layer 78 over semiconductor device 40, 42 (STEP 76, FIG. 1). First sacrificial strain layer 78 may comprise any one of a number of strain materials conventionally utilized in the semiconductor industry and capable of applying either a tensile or compressive stress to amorphized portions 72, 74 of fin structures 64 sufficient to induce a physical deformation with the crystal lattice thereof. As shown in FIG. 10, first sacrificial strain layer 78 overlies, and acts directly upon, three sides of each fin structure 64 included within P-type FinFET 40. Due to this multi-surface interface, first sacrificial strain layer 78 induces strain within amorphized portions 72, 74 of each fin structure 64 in a highly effective manner as compared to certain conventional stress memorization techniques wherein only a single side of a channel region is exposed directly to a strain material, such as in the above-described case of a deposited strained silicon nitride contact etch stop over a merged fin source-drain. Fin structures 64 of N-type FinFET 42, which do not include any amorphized regions at this juncture in the fabrication process, are substantially unaffected by application of sacrificial strain layer 78 during STEP 76 (FIG. 1).

The particular strain material utilized to form first sacrificial strain layer 78 will generally depend upon device characteristics; e.g., in the case of a non-planar transistor, the type of material will typically be chosen based, at least in part, upon transistor polarity. In a group of preferred embodiments, the sacrificial strain layer is formed from compressive strain material, such as compressive nitride, when stress is to be applied to the channel region of a P-type transistor; and from a tensile strain material, such as tensile nitride, when stress is to be applied to the channel region of an N-type transistor. Thus, during STEP 76 (FIG. 1) wherein first sacrificial strain layer 78 is utilized to apply stress to fin structures 64 of P-type FinFET 40, first sacrificial strain layer 78 preferably comprises compressive nitride. Further discussion of the various types of strain material that can be utilized to induce strain within the fin structures of one or more non-planar semiconductor devices, such as P-type FinFET 40 and N-type FinFET 42, is set-forth below in conjunction with STEP 88 of the exemplary semiconductor fabrication method shown in FIG. 1.

Figure 11:
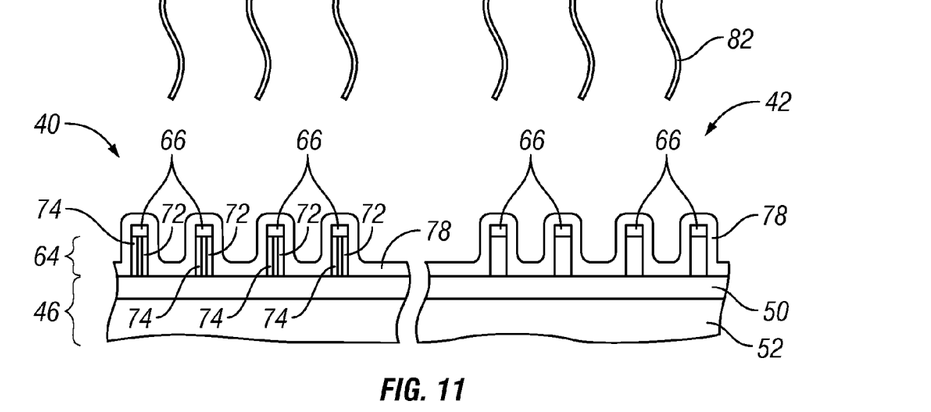

Next, as indicated in FIG. 11 at 82, semiconductor device 40, 42 is subjected to one or more annealing steps (STEP 80, FIG. 1). During annealing, amorphized portions 72, 74 of fin structures 64 recrystallize to accommodate the deformation induced by sacrificial strain layer 78; for example, if sacrificial strain layer 78 comprises compressive nitride, amorphized portions 72, 74 of fin structures 64 will recrystallize to accommodate the tensile deformation induced by strain layer 98. Annealing thus results in the recrystallization of amorphized portions 92, 94 of fin structures 64 in a stress memorized state. Consequently, after annealing, sacrificial strain layer 78 can be removed (STEP 80, FIG. 1) and amorphized portions 72, 74 of first sacrificial strain layer 78 will retain a strain-induced deformation and a corresponding increase in carrier mobility. The manner in which sacrificial strain layer 78 is removed will vary depending upon the material utilized to form strain layer 78. For example, if formed from compressive or tensile nitride as previously suggested, sacrificial strain layer 78 can be removed utilizing either hot phosphoric acid wet etch or a reactive ion etch in conjunction with a chlorine- or fluorine-based chemistry. Annealing of semiconductor device 40, 42 also helps heal any damage inflicted to the crystal lattice of fin structures 64 during previous ion implantation processes (STEP 68, FIG. 1).

Figure 12:
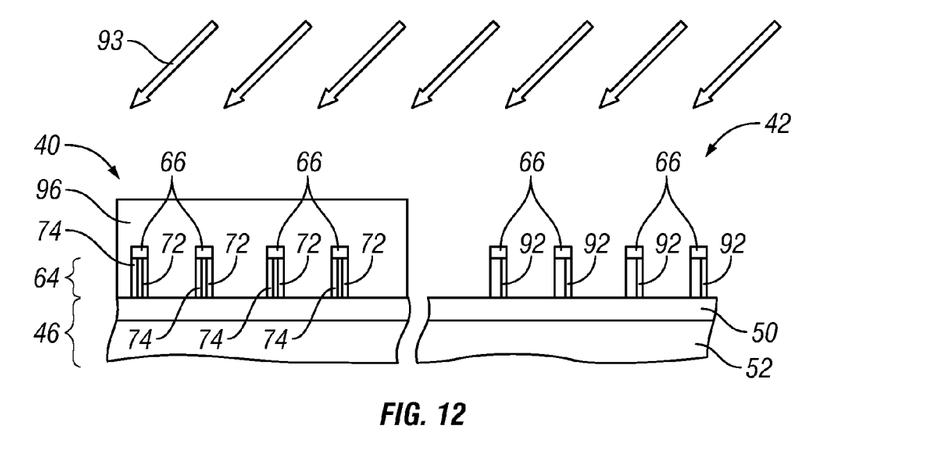
Figure 13:
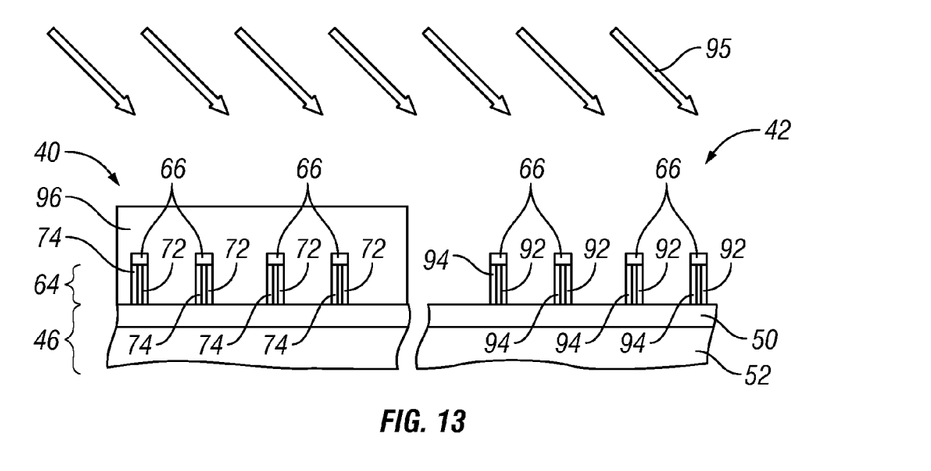
Figure 14:
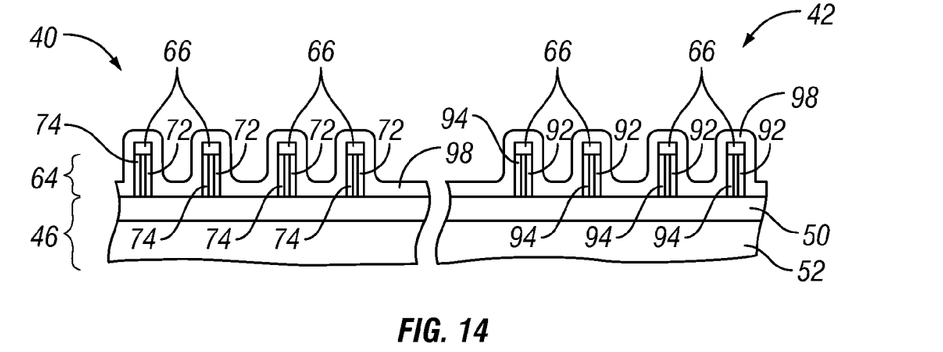

In certain embodiments, the fabrication method may proceed directly to the performance of conventional processing steps to complete fabrication of the semiconductor device after stress memory has been imparted to a single non-planar transistor or group of non-planar transistors included within the semiconductor device. However, in embodiments wherein the semiconductor device includes a second transistor complementary to a first transistor, additional steps may be performed to impart stress memory to the second transistor. In this respect, and pursuant to the exemplary method illustrated in FIG. 1, several additional steps (i.e., STEPS 86, 88, 90) are performed to impart stress memory to N-type FinFET 42 as illustrated in FIGS. 12-16. In many respects, STEPS 86, 88, and 90 are similar to STEPS 68, 76, and 80 performed to impart stress memory to P-type FinFET 40 as described above. For example, during STEP 86 (FIG. 1), a second patterned implant is performed to amorphize at least one portion of each fin structure 64 included within N-type FinFET 42. More specifically, during STEP 86 (FIG. 1), a first angled ion implantation process is first performed to amorphize a first sidewall portion 92 of each fin structure 64 included within N-type FinFET 42 as illustrated generically in FIG. 12 at 93. Also during STEP 86 (FIG. 1), a second angled ion implantation is subsequently performed to amorphize a first sidewall portion 92 of each fin structure 64 included within N-type FinFET 42 as illustrated generically in FIG. 13 at 95. Semiconductor device 40, 42 is bombarded with ions from a first predetermined direction during the first ion implantation process (FIG. 12) and from a second predetermined direction substantially opposite the first predetermined direction during the second ion implantation process (FIG. 13). As illustrated in FIGS. 12 and 13, a mask 96 is positioned over P-type FinFET 40 to prevent amphorization of fin structures 64 included within P-type FinFET 40 during the ion implantation processes. As noted above, the ion implantation processes can controlled such that other regions of fin structures 64 (e.g., inner regions of fin structures 64) are amorphized in alternative embodiments in addition to, or in lieu of, opposing sidewall portions 92 and 94 of fin structures 64.

Next, during STEP 88 of the exemplary semiconductor fabrication method (FIG. 1), a second sacrificial strain layer 98 is blanket deposited over semiconductor device 40, 42. As indicated above, second sacrificial strain layer 98 may comprise any material capable of applying either a compressive or tensile stress to fin structures 64 sufficient to physically deform within the crystal lattice of amorphized portions 92, 94 and thereby improve carrier mobility. As was the case previously, second sacrificial strain layer 98 overlies, and acts directly upon, three sides of each fin structure 64 included within N-type FinFET 42; consequently, sacrificial strain layer 98 applies stress to and induces strain within amorphized portions 92, 94 of sacrificial strain layer 98 in a highly effective manner.

The particular strain material utilized to form second sacrificial strain layer 98 will generally depend upon device characteristics and, specifically, upon transistor polarity. In a preferred group of embodiments, second sacrificial strain layer 98 is formed from a strain material having a polarity opposite the strain material from which first sacrificial strain layer 78 is formed; e.g., in embodiments wherein first sacrificial strain layer 78 is formed from compressive nitride, second sacrificial strain layer 98 is preferably formed from tensile nitride. This preference notwithstanding, various other combinations of strain material can be utilized to impart stress memory to non-planar transistors of opposing polarities including strain materials that apply similar types of mechanical stress, but to varying degrees. For example, in certain embodiments, a first strain material that applies a greater compressive stress can be utilized to induce strain within a first transistor, while a second strain material that applies a lesser compressive stress can be utilized to induce strain within a second complementary transistor. In further embodiments, a neutral strain material (e.g., neutral nitride) can be deposited over selected features of the semiconductor device (e.g., those associated with Magnetic Random Access Memory) to minimize or eliminate the application of stress thereto.

Figure 15:
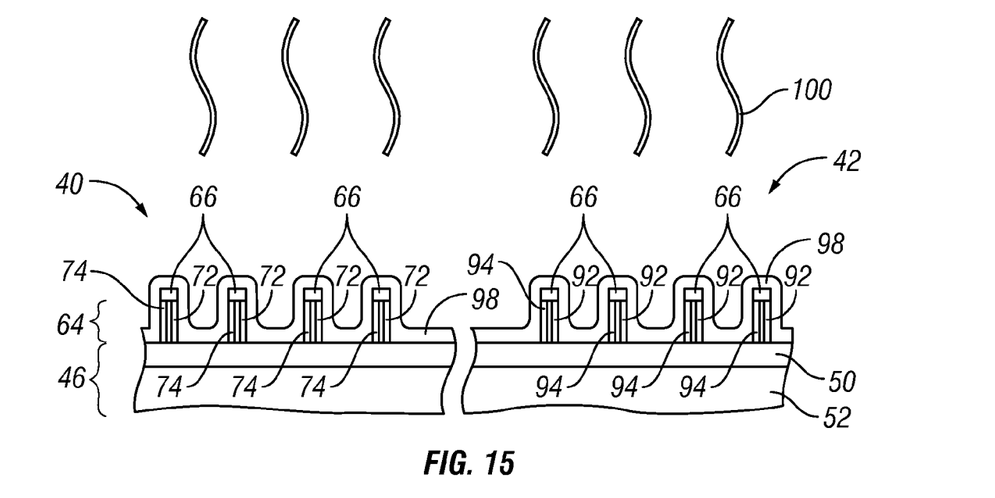
Figure 16:
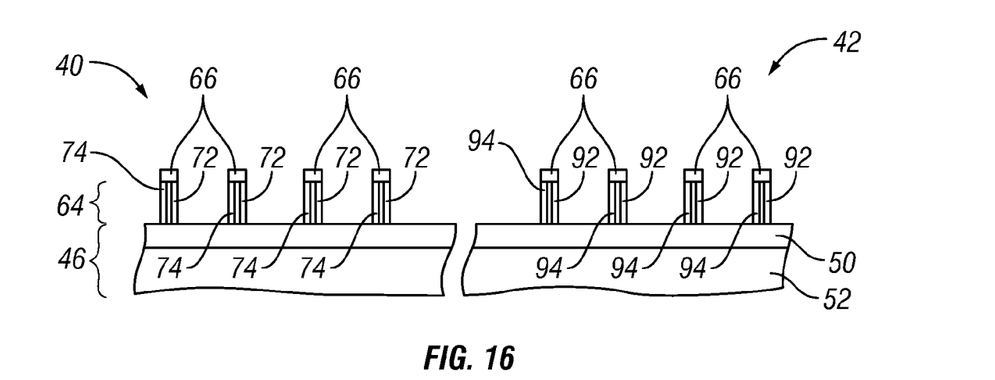

As indicated in FIG. 15 at 100, semiconductor device 40, 42 is next subjected to one or annealing steps to recrystallize amorphized portions 92, 94 of fin structures 64 in a stress-memorized state (STEP 90, FIG. 1). During annealing, amorphized portions 92, 94 of fin structures 64 recrystallize to accommodate the deformation induced by sacrificial strain layer 98; for example, if sacrificial strain layer 98 comprises tensile nitride, amorphized portions 92, 94 of fin structures 64 will recrystallize to accommodate the compressive deformation induced by layer 98. Annealing thus results in recrystallizing amorphized portions 92, 94 of fin structures 64 in a stress memorized state. As indicated in FIG. 16, second sacrificial strain layer 98 can then be removed utilizing either a wet etching process (e.g., a hot phosphoric acid wet etch) or a dry etching process (e.g., reactive ion etch) to yield a partially completed semiconductor device 40, 42 having improved carrier mobility in the channel regions of P-type FinFET 40 and in the channel regions of N-type FinFET 42.

Figure 17:
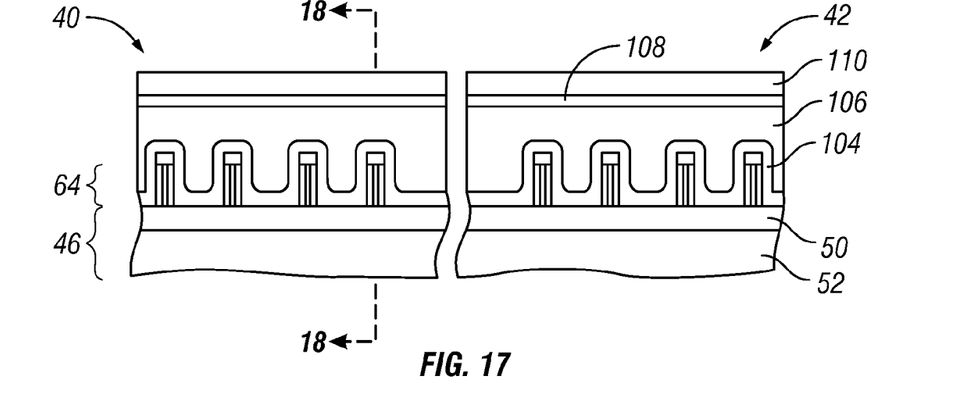

Lastly, at STEP 102 of the exemplary semiconductor fabrication process illustrated in FIG. 1, additional steps are performed to complete processing of semiconductor device 40, 42. The additional steps include the formation of one or more gate stacks overlying fin structures 64 of P-type FinFET 40 and N-type FinFET 42. For example, as illustrated in FIG. 17, a gate insulator layer 104 can be formed over fin structures 64 and the upper surface of semiconductor substrate 46. For example, gate insulator layer 104 can comprise a high-k dielectric material deposited over fin structures 64 and the exposed upper surface of semiconductor substrate 46 utilizing a vapor deposition process, such as chemical vapor deposition (CVD), low pressure chemical vapor deposition (LPCVD), or plasma enhanced chemical vapor deposition (PECVD). A non-exhaustive list of high-k dielectric materials that may be deposited to form gate insulator layer 104 includes hafnium dioxide, hafnium silicon oxide, titanium dioxide, tantalum pentoxide, zirconium dioxide, and various other compounds that have a relatively high dielectric constant as compared to silicon dioxide or silicon oxynitride.

With continued reference to FIG. 17, a conductive gate electrode layer 106 is next deposited over gate insulator layer 104 utilizing a conventional deposition technique, such as CVD, LPCVD, or PECVD. A non-exhaustive list of conductive materials suitable for use in the formation of gate electrode layer 106 includes a polycrystalline silicon and various metals and alloys, such as titanium nitride, tantalum nitride, hafnium silicide, and tantalum carbide. After the deposition of gate electrode layer 106, one or more mask layers are formed over gate electrode layer 106. In the exemplary illustrated embodiment, specifically, a single nitride capping layer 108 is deposited over conductive gate electrode layer 106. Nitride capping layer 108 can comprise silicon nitride deposited over gate electrode layer 106 utilizing a low temperature deposition process, such as PECVD, performed utilizing silane, ammonia, and/or nitrogen in the presence of an argon plasma.

Figure 18:
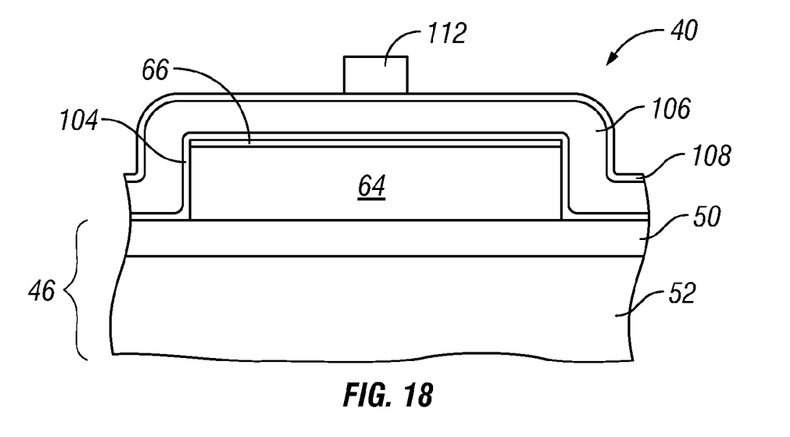
Figure 19:
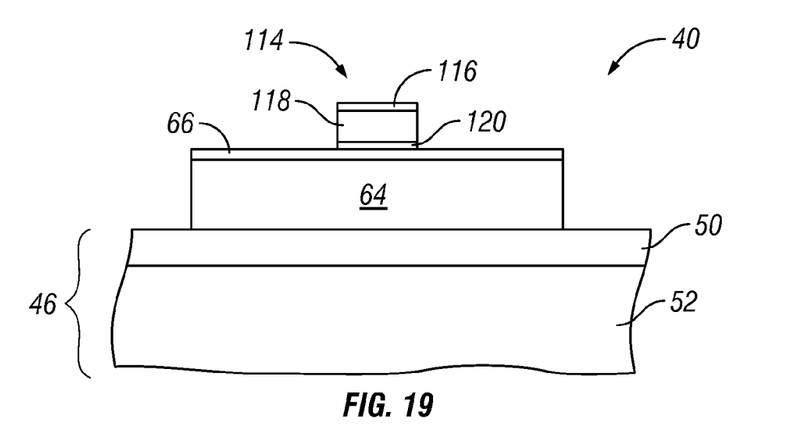

A photoresist layer 110 (FIG. 17) is next deposited over nitride capping layer 108 and patterned utilizing a photolithography process. As indicated in FIG. 18, which is a cross-sectional view of P-type FinFET 40 taken along line 18-18 (identified in FIG. 17), photolithography of photoresist layer 110 creates at least one mask structure 112 along the upper surface of nitride capping layer 108. With reference to FIG. 19, one or more etching processes are then performed to define at least one gate stack 114 from the portions of nitride capping layer 108, conductive gate electrode layer 106, and gate insulator layer 104 that are not located beneath mask structure 112. In the exemplary embodiment illustrated in FIG. 19, gate stack 114 includes: (i) a nitride cap 116 formed from nitride capping layer 108, (ii) a conductive gate electrode 118 formed from gate electrode layer 106, and (iii) a gate insulator 120 formed from gate insulator layer 104. As indicated in FIG. 19, mask structure 112 (FIG. 18) is subsequently removed utilizing a conventional etching process. A similar gate stack is also formed overlying fin structures 64 of N-type FinFET 42 (FIG. 17). As will be readily appreciated, numerous additional steps are performed after the formation of the gate stacks overlying FinFETs 40 and 42 to complete the fabrication of semiconductor device 40, 42; however, such steps are well-known in the industry and are not described herein in the interests of concision.

In view of the above, there has been provided an exemplary embodiment of a method suitable for fabricating a non-planar semiconductor device, such as a FinFET, wherein stress memory is effectively imparted to one or more fin structures included within the non-planar semiconductor device. While the foregoing exemplary embodiment was described above in conjunction with a particular type of non-planar semiconductor device (i.e., a FinFET), embodiments of the exemplary method are equally applicable to other types of non-planar devices including other types of non-planar, multi-gate semiconductor devices, such as triFETs. In the above-described exemplary embodiment, a first patterned ion implantation process and a first blanket strain layer deposition were performed to selectively impart stress to the amorphized portions of the fin structures included within an N-type transistor (i.e., FinFET 40 shown in FIGS. 2-19), and a second patterned ion implantation process and a second blanket strain layer deposition were performed to selectively impart stress to the amorphized portions of the fin structures included within a P-type transistor (i.e., FinFET 42 shown in FIGS. 2-17). However, in alternative embodiments, a blanket ion implantation step can be performed to simultaneously amorphized one or more selected portion of the fin structures included within a P-type transistor and the fin structures included within a N-type transistor. A first layer of strain material (e.g., compressive nitride) can then be pattern deposited over the P-type transistor, and a second layer of strain material (e.g., tensile nitride) can be patterned deposited over the transistor. Notably, in such embodiments, a single annealing step can be performed to recrystallize the amorphized portions of the N-type transistor and the P-type transistor in a stress memorized state thereby reducing the overall thermal budget of the semiconductor fabrication process.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a semiconductor device including a substrate, an N-type non-planar transistor having a first plurality of fin structures, and a P-type non-planar transistor having a second plurality of fin structures, the method comprising the steps of:
    selectively amorphorizing a portion of each fin structure included within the first plurality of fin structures utilizing at least a first angled ion implantation process;
    depositing a first sacrificial strain layer over the first plurality of fin structures to apply stress to the amorphized portions thereof;
    annealing the non-planar semiconductor device to recrystallize the amorphized portion of each fin structure included within the first plurality of fin structures in a stress-memorized state;
    removing the first sacrificial strain layer;
    selectively amorphorizing a portion of each fin structure included within the second plurality of fin structures utilizing at least a second angled ion implantation process;
    depositing a second sacrificial strain layer over the second plurality of fin structures to apply stress to the amorphized portions thereof;
    annealing the non-planar semiconductor device to recrystallize the amorphized portion of each fin structure included within the second plurality of fin structures in a stress-memorized state;
    removing the second sacrificial strain layer; and
    forming a plurality of gate stacks overlying the first and second pluralities of raised crystalline structures, the step of forming a plurality of gate stacks performed after the steps of annealing.

2. A method according to claim 1 wherein the step of depositing a first sacrificial strain layer comprises blanket depositing a first type of strain material over the semiconductor device, and wherein the step of depositing a second sacrificial strain layer comprises blanket depositing a second type of strain material over the semiconductor device, the second type of strain material different from the first type of strain material.

3. A method according to claim 2 wherein the first type of strain material and the second type of strain material are each selected from the group consisting of tensile nitride and compressive nitride.

4. A method according to claim 1 wherein the step of selectively amorphorizing comprises:
    positioning a mask over the second plurality of fin structures; and
    bombarding the first plurality of tin structures with an electrically neutral amorphizing species from a first predetermined direction forming an acute grazing angle with the substrate.

* * * * *